(12) United States Patent
Lee et al.

(10) Patent No.: US 10,147,537 B2
(45) Date of Patent: *Dec. 4, 2018

(54) FLUXGATE DEVICE WITH LOW FLUXGATE NOISE

(71) Applicant: Texas Instruments Incorporated, Dallas, TX (US)

(72) Inventors: Dok Won Lee, Mountain View, CA (US); Sudtida Lavangkul, Murphy, TX (US); Erika Lynn Mazotti, San Martin, CA (US); William David French, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/832,884

(22) Filed: Dec. 6, 2017

(65) Prior Publication Data

US 2018/0096784 A1    Apr. 5, 2018

Related U.S. Application Data

(63) Continuation of application No. 15/399,937, filed on Jan. 6, 2017, now Pat. No. 9,870,858, which is a (Continued)

(51) Int. Cl.
*H01L 27/02* (2006.01)
*H01F 27/34* (2006.01)
(Continued)

(52) U.S. Cl.
CPC ....... *H01F 27/346* (2013.01); *G01R 33/0029* (2013.01); *G01R 33/04* (2013.01);
(Continued)

(58) Field of Classification Search
CPC ..... G01D 3/0365; G01D 5/2013; G01D 5/202
(Continued)

(56) References Cited

U.S. PATENT DOCUMENTS

| 5,014,006 A | 5/1991 | Seitz |
| 6,566,862 B1 * | 5/2003 | Goto ................. G01D 3/0365 |
| | | 324/207.16 |

(Continued)

FOREIGN PATENT DOCUMENTS

EP    1052519 A1    11/2000

OTHER PUBLICATIONS

Fraux, Romain, "Technological and Cost Evolution of Consumer Inertial Combo Sensors," System Plus Consulting, presentation at Semicon Europa2014, Oct. 6-9, 2014 (35 pages).

(Continued)

*Primary Examiner* — S. V. Clark
(74) *Attorney, Agent, or Firm* — Tuenlap D. Chan; Charles A. Brill; Frank D. Cimino (57) ABSTRACT

An integrated fluxgate device, which includes a magnetic core, an excitation coil, and a sense coil. The magnetic core has a longitudinal edge and a terminal edge. The excitation coil coils around the longitudinal edge of the magnetic core, and the excitation coil has a first number of excitation coil members within a proximity of the terminal edge. The sense coil coils around the longitudinal edge of the magnetic core, and the sense coil has a second number of sense coil members within the proximity of the terminal edge. For reducing fluxgate noise, the second number of sense coil members may be less than the first number of excitation coil members within the proximity of the terminal edge.

20 Claims, 7 Drawing Sheets

Related U.S. Application Data continuation of application No. 15/141,003, filed on Apr. 28, 2016, now Pat. No. 9,577,185.

(51) Int. Cl.

| | | |
|---|---|---|
| *H01L 43/12* | (2006.01) | |
| *H01L 23/528* | (2006.01) | |
| *H01L 23/522* | (2006.01) | |
| *G01R 33/04* | (2006.01) | |
| *G01R 33/00* | (2006.01) | |
| *H01F 27/24* | (2006.01) | |
| *H01F 27/28* | (2006.01) | |
| *H01L 27/22* | (2006.01) | |
| *H01L 43/02* | (2006.01) | |

(52) U.S. Cl.
CPC .......... *H01F 27/24* (2013.01); *H01F 27/28* (2013.01); *H01L 23/528* (2013.01); *H01L 23/5226* (2013.01); *H01L 27/22* (2013.01); *H01L 43/02* (2013.01); *H01L 43/12* (2013.01)

(58) Field of Classification Search
USPC ................... 257/414, 421, 427, 798
See application file for complete search history.

(56) References Cited

U.S. PATENT DOCUMENTS

| | | |
|---|---|---|
| 6,949,386 B2 | 9/2005 | Piguet et al. |
| 9,030,198 B2 | 5/2015 | Schatz et al. |
| 9,291,648 B2 | 3/2016 | Snoeij et al. |
| 9,870,858 B2* | 1/2018 | Lee ............ H01F 27/346 |
| 2001/0040450 A1 | 11/2001 | Li et al. |
| 2003/0102862 A1* | 6/2003 | Goto ............ G01D 3/0365 |
| | | 324/207.16 |
| 2007/0257669 A1 | 11/2007 | Delevoye et al. |
| 2015/0160307 A1 | 6/2015 | Kim |

OTHER PUBLICATIONS

Snoeij, Martin F., et al., "An Integrated Fluxgate Magnetometer for use in Closed-Loop/Open-Loop Isolated Current Sensing," Texas Instruments, Freising, Germany, copyright IEEE 2015 (4 pages).
Notification of Transmittal of the International Search Report and the Written Opinion of the International Searching Authority, or the Declaration dated Aug. 24, 2017 (6 pages).

\* cited by examiner

FLUXGATE DEVICE WITH LOW FLUXGATE NOISE

CROSS REFERENCE TO RELATED APPLICATIONS

Under 35 U.S.C. § 120, this continuation application claims benefits of and priority to U.S. patent application Ser. No. 15/399,937, filed on Jan. 6, 2017, which claims benefits of and priority to U.S. patent application Ser. No. 15/141, 003, filed on Apr. 28, 2016. The entirety of the above referenced applications are hereby incorporated herein by reference.

BACKGROUND

A fluxgate device generally includes a magnetic core structure and coil members coiling around the magnetic core. A fluxgate device can be used as a magnetometer for detecting a change in magnetic flux in an environment adjacent to the magnetic core structure. Attempts have been made to interface a fluxgate device with an integrated circuit for adapting to various industrial applications. For instance, a fluxgate device interfaced with a control circuit can be adapted as current measurement devices for use in motor control systems, or as position sensing device for use in robotic systems. However, these solutions involve tradeoffs between high sensitivity and low noise performances.

SUMMARY

The present disclosure describes systems and techniques relating to the fabrication of fluxgate devices, which includes integrated fluxgate devices that are integrated with one or more circuits formed on a semiconductor substrate. More specifically, the present disclosure describes a fluxgate device that delivers high sensitivity performance with a relatively low susceptibility to fluxgate noise (e.g., Barkhausen noise). The disclosed fluxgate device includes a magnetic core, an excitation system, and a sense system. The excitation system including an excitation coil coiling around the magnetic core, whereas the sense system including a sense coil coiling around the magnetic core while interleaving with the excitation coil. The disclosed fluxgate device reduces the fluxgate noise introduced by unsaturated regions of the magnetic core as well as fabrication variations that cause cracks and delaminations around the edges of the magnetic core.

In one implementation, for example, the present disclosure describes an integrated fluxgate device, which includes a magnetic core, an excitation coil, and a sense coil. The magnetic core has a longitudinal edge and a terminal edge. The excitation coil coils around the longitudinal edge of the magnetic core, and the excitation coil has a first number of excitation coil members within a proximity of the terminal edge. The sense coil coils around the longitudinal edge of the magnetic core, and the sense coil has a second number of sense coil members within the proximity of the terminal edge. For reducing fluxgate noise, the second number of sense coil members may be less than the first number of excitation coil members within the proximity of the terminal edge.

In another implementation, for example, the present disclosure describes an integrated circuit, which includes a semiconductor substrate, a circuit having transistors formed in the semiconductor substrate, and a fluxgate device positioned above the circuit. The fluxgate device includes a magnetic core, an excitation coil, and a sense coil. The magnetic core has a longitudinal edge and a terminal region. The excitation coil is coupled to the circuit, and the excitation coil coils around the longitudinal edge of the magnetic core and extending to the terminal region. The sense coil is coupled to the circuit, and the sense coil coils around the longitudinal edge of the magnetic core. For reducing fluxgate noise, the sense coil may be terminated outside the terminal region.

In yet another implementation, for example, the present disclosure describes an integrated circuit, which includes a semiconductor substrate, a circuit having transistors formed in the semiconductor substrate, and a fluxgate device positioned above the circuit. The fluxgate device includes a magnetic core, a dielectric layer, an excitation coil, and a sense coil. The magnetic core has a longitudinal edge and a terminal region. The dielectric layer has an extension region abutting the terminal region of the magnetic core. The excitation coil is coupled to the circuit. The excitation coil coils around the longitudinal edge of the magnetic core and extend to the terminal region of the magnetic core and the extension region of the dielectric layer. The sense coil is coupled to the circuit, and the sense coil coiling around the longitudinal edge of the magnetic core. For reducing fluxgate noise, the sense coil may be terminated before reaching the terminal region of the magnetic core.

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

Figure 1:
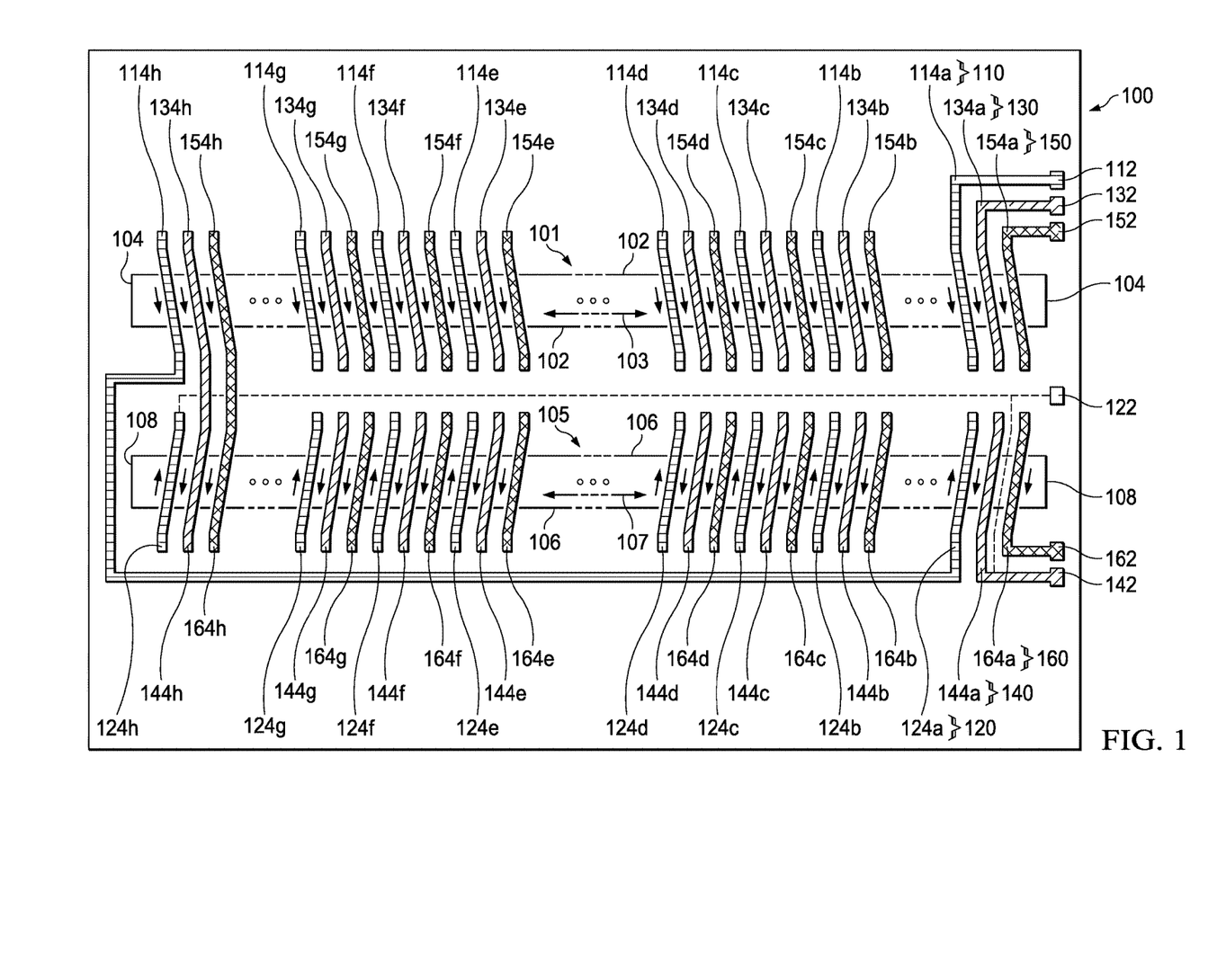
FIG. 1 shows a top view of a fluxgate device according to an aspect of the present disclosure.

FIG. 1 shows a top view of a fluxgate device 100 according to an aspect of the present disclosure. The fluxgate device 100 includes a first magnetic core 101 that is magnetized to form magnetic domain patterns. The first magnetic core 101 includes longitudinal edges 102 and terminal edges 104. The fluxgate device 100 includes a first excitation coil 110 coiling around the longitudinal edges 102 of the first magnetic core 101. The first excitation coil 110 includes a number of coil members (CM) having a first coiling direction (e.g. counterclockwise). The excitation CM 114a, 114b, 114c, 114c, 114d, 114e, 114f, 114g, 114h follow one another in sequence as they coil around the first magnetic core 101. Upon receiving an excitation signal from a first excitation terminal 112 and a second excitation terminal 122, the first excitation coil 110 is configured to generate a first excitation field along a first sensing direction 103 of the first magnetic core 101.

The fluxgate device 100 also includes a first compensation coil 130 coiling around the longitudinal edges 102 of the first magnetic core 101. The first compensation coil 130 includes a number of coil members (CM) having a first coiling direction (e.g. counterclockwise). In general, the compensation coil 130 has the same number of CM as the excitation coil 110. The compensation CMs 134a, 134b, 134c, 134c, 134d, 134e, 134f, 134g, 134h follow one another in sequence as they coil around the first magnetic core 101. Upon receiving a compensation signal from a first compensation terminal 132 and a second compensation terminal 142, the first compensation coil 130 is configured to generate a first compensation field along a first sensing direction 103 of the first magnetic core 101.

The fluxgate device 100 further includes a first sense coil 150 coiling around the longitudinal edges 102 of the first magnetic core 101. The first sense coil 150 includes a number of coil members (CM) having a first coiling direction (e.g. counterclockwise). The sense CMs 154a, 154b, 154c, 154c, 154d, 154e, 154f, 154g, 154h follow one another in sequence as they coil around the first magnetic core 101. Upon detecting a change in magnetic flux along the first sensing direction 103, the first sense coil 150 is configured to conduct a first sense signal between a first sense terminal 152 and a second sense terminal 162.

Depending on the sensing mechanism adopted, the fluxgate device 100 may operate in a differential mode. In that configuration, the fluxgate device 100 may additionally include a second magnetic core 105, a second excitation coil 120, a second compensation coil 140, and a second sense coil 160. Similar to the first magnetic core 101, the second magnetic core 105 includes longitudinal edges 106 and terminal edges 108. The second excitation coil 120 coils around the longitudinal edges 106 of the second magnetic core 105. To implement the differential mode, the second excitation coil 120 includes a number of coil members (CM) having a second coiling direction (e.g. clockwise) reversing the first coiling direction (e.g. counterclockwise). The excitation CM 124a, 124b, 124c, 124c, 124d, 124e, 124f, 124g, 124h is preceded by one another in sequence as they coil around the second magnetic core 105. Upon receiving an excitation signal from a first excitation terminal 112 and a second excitation terminal 122, the second excitation coil 120 is configured to generate a second excitation field along a second sensing direction 107 of the second magnetic core 105.

The second compensation coil 140 coils around the longitudinal edges 106 of the second magnetic core 105. To implement the differential mode, the second compensation coil 140 includes a number of coil members (CM) having a second coiling direction following the first coiling direction (e.g. counterclockwise). In general, the compensation coil 140 has the same number of CM as the excitation coil 120. The compensation CMs 144a, 144b, 144c, 144c, 144d, 144e, 144f, 144g, 144h is preceded by one another in sequence as they coil around the second magnetic core 105. Upon receiving a compensation signal from a first compensation terminal 132 and a second compensation terminal 142, the second compensation coil 140 is configured to generate a second compensation field along a second sensing direction 107 of the second magnetic core 105.

The second sense coil 160 coils around the longitudinal edges 106 of the second magnetic core 105. To facilitate the differential mode, the second sense coil 160 includes a number of coil members (CM) following the first coiling direction (e.g. counterclockwise). The sense CMs 164a, 164b, 164c, 164c, 164d, 164e, 164f, 164g, 164h follow one another in sequence as they coil around the second magnetic core 105. Upon detecting a change in magnetic flux along the second sensing direction 107, the second sense coil 160 is configured to conduct a second sense signal between a first sense terminal 152 and a second sense terminal 162.

In general, the excitation coil (e.g., 110 and 120) interleaves with the sense coil (e.g., 150 and 160) to provide high sensitivity performance in magnetic field sensing. Thus, the excitation coil (e.g., 110 and 120) may include the same number of coil members as the sense coil (e.g., 150 and 160) along the entire longitudinal edge (e.g., 102 and 106) of the magnetic core (e.g., 106). Such a configuration however, may leave the fluxgate device 100 susceptible to fluxgate noises generated around the terminal edges (e.g., 104 and 108) of the magnetic core (e.g., 101 and 105).

For instance, Barkausen noise may be a contributor to the fluxgate noise, and it is due to fluctuation of magnetic domain walls. In particular, unsaturated portions of the magnetic core (e.g., 101 and 105) near the terminal edges (e.g., 104 and 108) are likely to increase this type of fluxgate noise. Moreover, the magnetic core (e.g., 101 and 105) and its surrounding may incur some forms of structural deviations during the fabrication process of the fluxgate device 100. These structural deviations can be caused by delaminations of the magnetic core (e.g., 101 and 105) and/or cracks formed within a dielectric layer surrounding the magnetic core (e.g., 101 and 105). These structural deviations are likely to be incurred around the terminal edges (e.g., 104 and 108) of the magnetic core (e.g., 101 and 105), thereby contributing to the overall level of fluxgate noise as well.

The present disclosure provides several approaches to minimize the impact of fluxgate noises. One approach involves preventing the sense coil (e.g., 150 and 160) from picking up the fluxgate noise around the terminal edges (e.g., 104 and 108) of the magnetic core (e.g., 101 and 105). Another approach involves reducing the fluxgate noises by generating a more uniform magnetic field around the terminal edges (e.g., 104 and 108) of the magnetic core (e.g., 101 and 105). Yet another approach involves reducing the fluxgate noises by minimizing structural deviations around terminal edges (e.g., 104 and 108) of the magnetic core (e.g., 101 and 105).

Figure 2A:
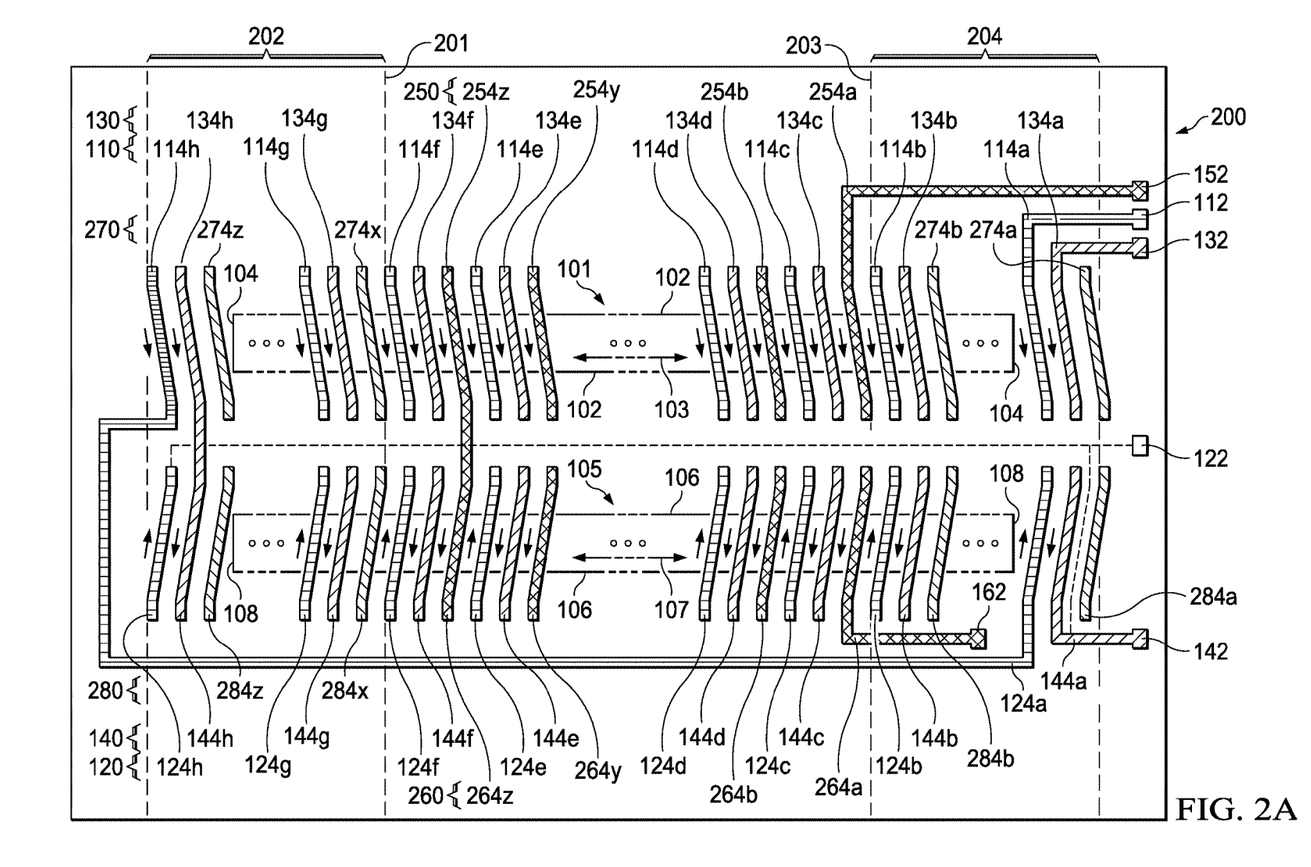
FIG. 2A shows a top view of a fluxgate device with low fluxgate noise according to an aspect of the present disclosure.

FIG. 2A shows a top view of a fluxgate device 200 with high sensitivity and low fluxgate noise according to an aspect of the present disclosure. The fluxgate device 200 adopts an architecture in which the sense coil has less coil members around the terminal edges of the magnetic core than around a center portion of the magnetic core. The reduction of coil members around the terminal edge helps reduce the amount of fluxgate noise being detected by the sense coil.

In one configuration, for example, the fluxgate device 200 includes a first sense coil 250 coiling around the first longitudinal edges 102 of the first magnetic core 101. To reduce the amount of fluxgate noise being picked up around a first proximity 202 of the terminal edge 104, the first sense coil 250 has a less number of coil members within the first proximity 202 than the first excitation coil 110. For instance, the first sense coil 250 may have zero coil members within the first proximity 202, whereas the first excitation coil 110 may have two or more coil members (e.g., 114g and 114h). Likewise, to reduce the amount of fluxgate noise being picked up around a second proximity 204 of the terminal edge 104, the first sense coil 250 has a less number of coil members within the second proximity 204 than the first excitation coil 110. For instance, the first sense coil 250 may have zero coil members within the second proximity 204, whereas the first excitation coil 110 may have two or more coil members (e.g., 114a and 114b). In a configuration where the first sense coil 250 has zero coil member in both the first proximity 202 and the second proximity 204, the first sense coil 250 may include coil members 254a, 254b, 254y, and 254z following one another in sequence as they coil around the center portion of the first magnetic core 101 in the same coiling direction (e.g., counterclockwise) as the first excitation coil 110.

The fluxgate device 200 may operate in a differential mode. In that configuration, the fluxgate device 200 may include the second magnetic core 105, the second excitation coil 120, and the second compensation coil 140 as described in FIG. 1, as well as a second sense coil 260 that is coupled to the first sense coil 250 via an inter-coil connector 258. The second sense coil 260 coils around the second longitudinal edges 106 of the second magnetic core 105. To reduce the amount of fluxgate noise being picked up around the first proximity 202 of the terminal edge 108, the second sense coil 260 has a less number of coil members within the first proximity 202 than the second excitation coil 120. For instance, the second sense coil 260 may have zero coil members within the first proximity 202, whereas the first excitation coil 110 may have two or more coil members (e.g., 114g and 114h). Likewise, to reduce the amount of fluxgate noise being picked up around a second proximity 204 of the terminal edge 108, the second sense coil 260 has a less number of coil members within the second proximity 204 than the first excitation coil 110. For instance, the second sense coil 260 may have zero coil members within the second proximity 204, whereas the first excitation coil 110 may have two or more coil members (e.g., 114a and 114b). In a configuration where the second sense coil 250 has zero coil member in both the first proximity 202 and the second proximity 204, the second sense coil 260 may include coil members 264a, 264b, 264y, and 264z following one another in sequence as they coil around the center portion of the second magnetic core 105 in the opposite coiling direction (e.g., counterclockwise) as the second excitation coil 120. Because the first and second sense coils 250 and 260 terminate before reaching the first proximity 202 and the second proximity 204, the inter-coil connector 258 may also be routed to avoid the first and second proximities 202 and 204.

The proximity (e.g., 202 and/or 204) of a terminal edge (e.g., 104 and/or 108) can be understood as a region that is pulled-back from the terminal edge 104 and/or a region that is extended from the terminal edge 104, in which the fluxgate noise level is relatively high when compared to the center portion of the magnetic core (e.g., 101 and/or 105). To reduce the amount of fluxgate noise being picked up or detected by the first sense coil 250, the number of coil members of the first sense coil 250 may be substantially reduced within the proximity of the terminal edge. And similarly, to reduce the amount of fluxgate noise to be picked up or detected by the second sense coil 260, the number of coil members of the second sense coil 260 may be substantially reduced within the proximity of the terminal edge.

Figure 3:
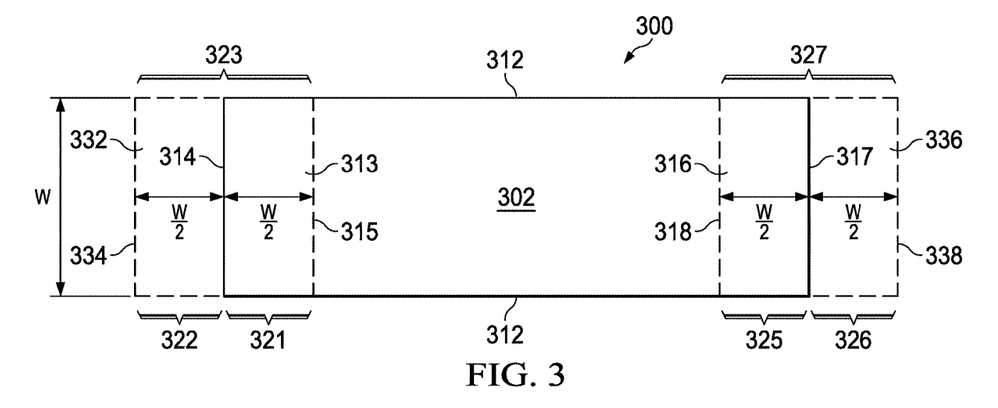
FIG. 3 shows a top partial exposed view of a fluxgate device with low fluxgate noise according to an aspect of the present disclosure.

FIG. 3 shows a top partial exposed view of a fluxgate device 300 with low fluxgate noise according to an aspect of the present disclosure. For the purpose of defining the proximity of the terminal edge in greater structural details, the fluxgate device 300 purports to illustrate the geometric features of the magnetic core 302, which is similar to the first and second magnetic cores 101 and 105, as well as its surroundings. Like the magnetic cores 101 and 105, the magnetic core 302 includes longitudinal edges 312, a first terminal edge 314 and a second terminal edge 317. Each of the terminal edges 314 and 317 may be a straight line edge that has a width W.

In one implementation, the proximity 323 of the first terminal edge 314 may encompass a first terminal region 313. The first terminal region 313 is defined between the first terminal edge 314 and a first pulled back edge 315, which is receded from the first terminal edge 314 toward the center of the magnetic core 302 by a first pulled back distance 321. The first pulled back distance 321 may be determined based on the fluxgate noise level around the first terminal edge 314. Experiments and simulations have shown that the first pulled back distance 321 may be approximated (with a plus or minus 10% margin) by a half of the width (W/2) of the first terminal edge 314. For instance, where the width of the first terminal edge 314 is 100 um, the first pulled back distance 321 may range from 45 um to 55 um.

In another implementation, the proximity 323 of the first terminal edge 314 may encompass a first extension region 332. The first extension region 332 is a part of a dielectric layer surrounding and abutting the magnetic core 302. The first extension region 332 is defined between the first terminal edge 314 and a first extension edge 334, which extends from the first terminal edge 314 and pulls away from the center of the magnetic core 302 by a first extension distance 322. The first extension distance 322 may be determined based on the fluxgate noise level around the first terminal edge 314. Experiments and simulations have shown that the first extension distance 322 may be approximated (with a plus or minus 10% margin) between a fourth of the width (W/4) and a half of the width (W/2) of the first terminal edge 314. For instance, where the width of the first terminal edge 314 is 100 um, the first extension distance 322 may range from 22.5 um to 55 um.

In yet another implementation, the proximity 323 of the first terminal edge 314 may encompass both the first terminal region 313 and the first extension region 332. As such, the proximity 323 of the first terminal edge 314 is defined between the first pull back edge 315 and the first extension edge 334.

To reduce the impact of fluxgate noise around the first terminal edge 314, the sense coil (e.g., 250 and/or 260) may reduce the number of coil members to be less than that of the excitation coil (e.g., 110 and/or 120) within the proximity 323 of the first terminal edge 314. To further reduce the impact of the fluxgate noise around the first terminal edge 314, the sense coil (e.g., 250 and/or 260) may terminate outside of, and before reaching, the first extension region 332. To minimize the impact of the fluxgate noise around the first terminal edge 314, the sense coil (e.g., 250 and/or 260) may even terminate outside of, and before reaching, the first terminal region 313. In that case, the sense coil (e.g., 250 and/or 260) will have zero coil member within the proximity 323 of the first terminal edge 314.

In addition to the coil member reduction within the proximity 323 of the first terminal edge 314, the sense coil (e.g., 250 and/or 260) may undergo further coil member reduction within the proximity 327 of the second terminal edge 317 where the fluxgate noise around the second terminal edge 317 is determined to be sufficiently high.

In one implementation, the proximity 327 of the second terminal edge 317 may encompass a second terminal region 316. The second terminal region 316 is defined between the second terminal edge 317 and a second pulled back edge 318, which is receded from the second terminal edge 317 toward the center of the magnetic core 302 by a second pulled back distance 325. The second pulled back distance 325 may be determined based on the fluxgate noise level around the second terminal edge 317. Experiments and simulations have shown that the second pulled back distance 325 may be approximated (with a plus or minus 10% margin) by a half of the width (W/2) of the second terminal edge 317. For instance, where the width of the second terminal edge 317 is 100 um, the second pulled back distance 325 may range from 45 um to 55 um.

In another implementation, the proximity 327 of the second terminal edge 317 may encompass a second extension region 336. The second extension region 336 is a part of a dielectric layer surrounding and abutting the magnetic core 302. The second extension region 336 is defined between the second terminal edge 317 and a second extension edge 338, which extends from the second terminal edge 317 and pulls away from the center of the magnetic core 302 by a second extension distance 326. The second extension distance 326 may be determined based on the fluxgate noise level around the second terminal edge 317. Experiments and simulations have shown that the second extension distance 326 may be approximated (with a plus or minus 10% margin) between a fourth of the width (W/4) and a half of the width (W/2) of the second terminal edge 317. For instance, where the width of the second terminal edge 317 is 100 um, the second extension distance 326 may range from 22.5 um to 55 um.

In yet another implementation, the proximity 327 of the second terminal edge 317 may encompass both the second terminal region 316 and the second extension region 336. As such, the proximity 327 of the second terminal edge 317 is defined between the second pull back edge 318 and the second extension edge 338

To reduce the impact of fluxgate noise around the second terminal edge 317, the sense coil (e.g., 250 and/or 260) may reduce the number of coil members to be less than the excitation coil (e.g., 110 and/or 120) within the proximity 327 of the second terminal edge 317. To further reduce the impact of the fluxgate noise around the second terminal edge 317, the sense coil (e.g., 250 and/or 260) may terminate outside of, and before reaching, the second extension region 336. To minimize the impact of the fluxgate noise around the second terminal edge 317, the sense coil (e.g., 250 and/or 260) may even terminate outside of, and before reaching, the second terminal region 316. In that case, the sense coil (e.g., 250 and/or 260) will have zero coil member within the proximity 327 of the second terminal edge 317.

Referring again to FIG. 2A, the fluxgate device 200 may include additional features to reduce the impact of fluxgate noise besides reducing the number of sense coil members within the proximities 202 and 204 of the terminal edges 104 and 108. For instance, the fluxgate device 200 may adopt an architecture that allows magnetic fields to be distributed more uniformly around the proximities 202 and 204 of the terminal edges 104 and 108. In general, the level of fluxgate noise is lower where the magnetic field to be measured is more uniformly distributed.

One way of creating a more uniformly distributed magnetic field is by extending the excitation coil (e.g., 110 and/or 120) beyond the terminal edges (e.g., 104 and 108) of the magnetic core (e.g., 101 and/or 105). For instance, the coil members 114a and 114h of the first excitation coil 110 may extend to, and coil around, the extension region (e.g., 336 and 332 as shown in FIG. 3) of a dielectric layer that abuts the terminal edges 104 of the magnetic core 101. Similarly, the coil members 124a and 124h of the second excitation coil may extend to, and coil around, the extension region (e.g., 336 and 332 as shown in FIG. 3) of the dielectric layer that abuts the terminal edges 108 of the magnetic core 105.

Moreover, the compensation coils (e.g., 130 and 140) may extend beyond the terminal edge (e.g., 104 and 108) of the magnetic core (e.g., 101 and 105) to further facilitate a more uniformly distributed magnetic field. For instance, the coil members 134a and 134h of the first compensation coil 130 may extend to, and coil around, the extension region (e.g., 336 and 332 as shown in FIG. 3) of the dielectric layer that abuts the terminal edges 104 of the magnetic core 101. The extended coil members 134a and 134h of the first compensation coil 130 may respectively interleave with the extended coil members 114a and 114h of the first excitation coil 110. Similarly, the coil members 144a and 144h of the second compensation coil 140 may extend to, and coil around, the extension region (e.g., 336 and 332 as shown in FIG. 3) of the dielectric layer that abuts the terminal edges 108 of the magnetic core 105. The extended coil members 144a and 144h of the second compensation coil 140 may respectively interleave with the extended coil members 124a and 124h of the second excitation coil 120.

In addition to creating a more uniformly distributed magnetic field around the terminal edges (e.g., 104 and/or 108), these extended coil members (e.g., 114a, 114h, 124a, 124h, 134a, 134h, 144a, and/or 144h) also serves to promote the structural integrity of the magnetic core and the dielectric layer surrounding the magnetic core. For instance, the extended coil members (e.g., 114a, 114h, 124a, 124h, 134a, 134h, 144a, and/or 144h) prevents the magnetic core (e.g., 101 and/or 105) from undergoing delaminations during thermal processes and protects the dielectric layer from cracking as well. Thus, these extended coil members minimizes structural deviations, which may otherwise increase the overall fluxgate noises around the terminal edges of the magnetic core.

Figure 4:
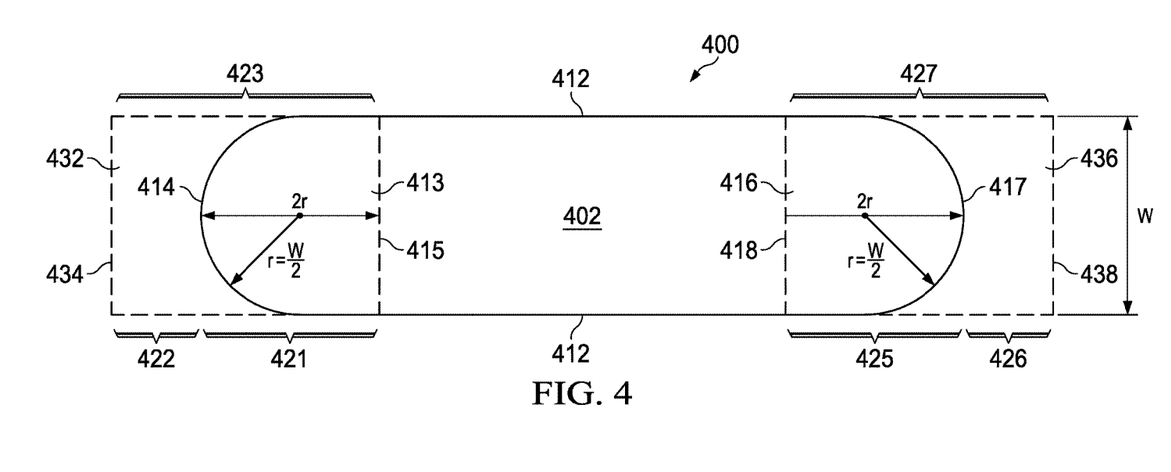
FIG. 4 shows a top partial exposed view of a fluxgate device with low fluxgate noise according another aspect of the present disclosure.

Yet another way of creating a more uniformly distributed magnetic field may involve having one or more curved terminal edges instead of straight line terminal edges. For instance, FIG. 4 shows a top partial exposed view of a fluxgate device 400 with low fluxgate noise by incorporating terminal edges that curve convexly outward from the center of the magnetic core.

The fluxgate device 400 purports to illustrate the geometric features of the magnetic core 402, which is similar to the first and second magnetic core 101 and 105, and its surroundings for defining the proximity of the terminal edge in greater structural details. Like the magnetic cores 101 and 105, the magnetic core 402 includes longitudinal edges 412. Modified from the magnetic cores 101 and 105, the magnetic core 402 includes terminal edges that protrude from the center of the magnetic core 402. In particular, the magnetic core 402 includes a first terminal protrusion edge 414 and a second terminal protrusion edge 417. Each of the terminal protrusion edges 414 and 417 may be a curved edge with a radius of curvature (r) that is roughly a half of the width (W) of the magnetic core 402. The curved terminal protrusion edges 414 and 417 provide a more uniform demagnetization field in the magnetic core 402. Moreover, the curved terminal protrusion edges 414 and 417 promote the structural integrity of the magnetic core 402 by suppression crack formations around these edges.

Depending on whether the curved edge has a uniform curvature, the radius of curvature (r) may vary along the curved edge. In the event that the curved edge is a semi-circular edge, the curved edge has a uniform curvature defined by the radius of the semi-circular edge. At a far end of the curved edge, the radius of curvature (r) may represent a protrusion distance by which the curved edge protrudes away from the straight line edge (e.g., 314 and/or 317) counterpart of the magnetic core 302 (as shown in FIG. 3). Like in the fluxgate device 300, the proximity of the terminal protrusion edge defines a region in which the sense coil has a lesser number of coil members than the excitation coil.

In one implementation, the proximity 423 of the first terminal protrusion edge 414 may encompass a first terminal region 413. The first terminal region 413 is defined between the first terminal protrusion edge 414 and a first pulled back edge 415, which is receded from the first terminal protrusion edge 414 toward the center of the magnetic core 402 by a first pulled back distance 421. The first pulled back distance 421 may be determined based on the fluxgate noise level around the first terminal protrusion edge 414. Experiments and simulations have shown that the first pulled back distance 421 may be approximated (with a plus or minus 10% margin) by two times the protrusion distance, the total of which is roughly the width (W) of the first terminal protrusion edge 414. For instance, where the width of the first terminal protrusion edge 414 is 100 um, the first pulled back distance 421 may range from 90 um to 110 um.

In another implementation, the proximity 423 of the first terminal protrusion edge 414 may encompass a first extension region 432. The first extension region 432 is a part of a dielectric layer surrounding the magnetic core 402. The first extension region 432 is defined between the first terminal protrusion edge 414 and a first extension edge 434, which extends from the first terminal protrusion edge 414 and pulls away from the center of the magnetic core 402 by a first extension distance 422. The first extension distance 422 may be determined based on the fluxgate noise level around the first terminal protrusion edge 414. Experiments and simulations have shown that the first extension distance 422 may range (with a plus or minus 10% margin) one-half to a full length of the protrusion distance, which is roughly between one fourth of the width (W/4) and one half of the width (W/2) of the first terminal protrusion edge 414. For instance, where the width of the first terminal protrusion edge 414 is 100 um, the first extension distance 422 may range from 22.5 um to 55 um.

In yet another implementation, the proximity 423 of the first terminal protrusion edge 414 may encompass both the first terminal region 413 and the first extension region 432. As such, the proximity 423 of the first terminal protrusion edge 414 is defined between the first pull back edge 415 and the first extension edge 434.

To reduce the impact of fluxgate noise around the first terminal protrusion edge 414, the sense coil (e.g., 250 and/or 260) may reduce the number of coil members to be less than the excitation coil (e.g., 110 and/or 120) within the proximity 423 of the first terminal protrusion edge 414. To further reduce the impact of the fluxgate noise around the first terminal protrusion edge 414, the sense coil (e.g., 250 and/or 260) may terminate outside of, and before reaching, the first extension region 432. To minimize the impact of the fluxgate noise around the first terminal protrusion edge 414, the sense coil (e.g., 250 and/or 260) may even terminate outside of, and before reaching, the first terminal region 413. In that case, the sense coil (e.g., 250 and/or 260) will have zero coil member within the proximity 423 of the first terminal protrusion edge 414.

In addition to the coil member reduction within the proximity 423 of the first terminal protrusion edge 414, the sense coil (e.g., 250 and/or 260) may undergo further coil member reduction within the proximity 427 of the second terminal protrusion edge 417 where the fluxgate noise around the second terminal protrusion edge 417 is determined to be sufficiently high.

In one implementation, the proximity 427 of the second terminal protrusion edge 417 may encompass a second terminal region 416. The second terminal region 416 is defined between the second terminal protrusion edge 417 and a second pulled back edge 418, which is receded from the second terminal protrusion edge 417 toward the center of the magnetic core 402 by a second pulled back distance 425. The second pulled back distance 425 may be determined based on the fluxgate noise level around the second terminal protrusion edge 417. Experiments and simulations have shown that the second pulled back distance 425 may be approximated (with a plus or minus 10% margin) by two times the protrusion distance, the total of which is roughly the width (W) of the second terminal protrusion edge 417. For instance, where the width of the second terminal protrusion edge 417 is 100 um, the second pulled back distance 425 may range from 90 um to 110 um.

In another implementation, the proximity 427 of the second terminal protrusion edge 417 may encompass a second extension region 436. The second extension region 436 is a part of a dielectric layer surrounding the magnetic core 402. The second extension region 436 is defined between the second terminal protrusion edge 417 and a second extension edge 438, which extends from the second terminal protrusion edge 417 and pulls away from the center of the magnetic core 402 by a second extension distance 426. The second extension distance 426 may be determined based on the fluxgate noise level around the second terminal protrusion edge 417. Experiments and simulations have shown that the second extension distance 426 may range (with a plus or minus 10% margin) from one-half to a full length of the protrusion distance, which is roughly between one fourth of the width (W/4) and one half of the width (W/2) of the second terminal protrusion edge 417. For instance, where the width of the second terminal protrusion edge 417 is 100 um, the second extension distance 426 may range from 22.5 um to 55 um.

In yet another implementation, the proximity 427 of the second terminal protrusion edge 417 may encompass both the second terminal region 416 and the second extension region 436. As such, the proximity 427 of the second terminal protrusion edge 417 is defined between the second pull back edge 418 and the second extension edge 438.

To reduce the impact of fluxgate noise around the second terminal protrusion edge 417, the sense coil (e.g., 250 and/or 260) may reduce the number of coil members to be less than the excitation coil (e.g., 110 and/or 120) within the proximity 427 of the second terminal protrusion edge 417. To further reduce the impact of the fluxgate noise around the second terminal protrusion edge 417, the sense coil (e.g., 250 and/or 260) may terminate outside of, and before reaching, the second extension region 436. To minimize the impact of the fluxgate noise around the second terminal protrusion edge 417, the sense coil (e.g., 250 and/or 260) may even terminate outside of, and before reaching, the second terminal region 416. In that case, the sense coil (e.g., 250 and/or 260) will have zero coil member within the proximity 427 of the second terminal protrusion edge 417.

Referring again to FIG. 2A, the fluxgate device 200 may include further features to reduce fluxgate noise in addition to extending coil members of the excitation coil (and optionally the compensation coil as well) and providing curved terminal edges. In particular, the fluxgate device 200 may adopt an architecture that allows magnetic fields to be distributed more uniformly by using dummy coils within the proximities 202 and 204 of the terminal edges 104 and 108. For instance, the fluxgate device 200 may include a first dummy coil 270 and a second dummy coil 280.

In one implementation, the first dummy coil 270 may include coil members 274a and 274b that interleave with the first excitation coil 110 and the first compensation coil 130 within the second proximity 204. In another implementation, the first dummy coil 270 may include coil members 274x and 274z that interleave with the first excitation coil 110 and the first compensation coil 130 within the first proximity 202. In yet another implementation, the first dummy coil 270 may include coil members 274a, 274b, 274x, and 274z located within both the first proximity 202 and the second proximity 204.

Similarly, the second dummy coil 280 may include coil members 284a and 284b that interleave with the second excitation coil 120 and the second compensation coil 140 within the second proximity 204 in one implementation. Alternatively, the second dummy coil 280 may include coil members 284x and 284z that interleave with the second excitation coil 120 and the first compensation coil 140 within the first proximity 202 in another implementation. Furthermore, the second dummy coil 280 may include coil members 284a, 284b, 284x, and 284z located within both the first proximity 202 and the second proximity 204 in yet another implementation.

According to an aspect of the present disclosure, the dummy coils 270 and 280 can be fabricated using the same process and the same mask as the sense coils 250 and 260. Moreover, the dummy coils 270 and 280 may be fitted within a location where the sense coils 250 and 260 would otherwise be placed if the sense coils 250 and 260 has not been pulled back from the proximities 202 and 204 of the terminal edges 104 and 108. The dummy coils 270 and 280 are not connected to the sense coils 250 and 260, and thus, they does not serve the same electromagnetic functions as the sense coils 250 and 260. Nevertheless, the dummy coils 270 and 280 may provide the same structural and mechanical functions as the sense coils 250 and 260 as if the sense coils 250 and 260 have not been pulled back from the proximity (e.g., 202 and/or 204) of the terminal edge (e.g., 104 and/or 108).

Figure 2B:
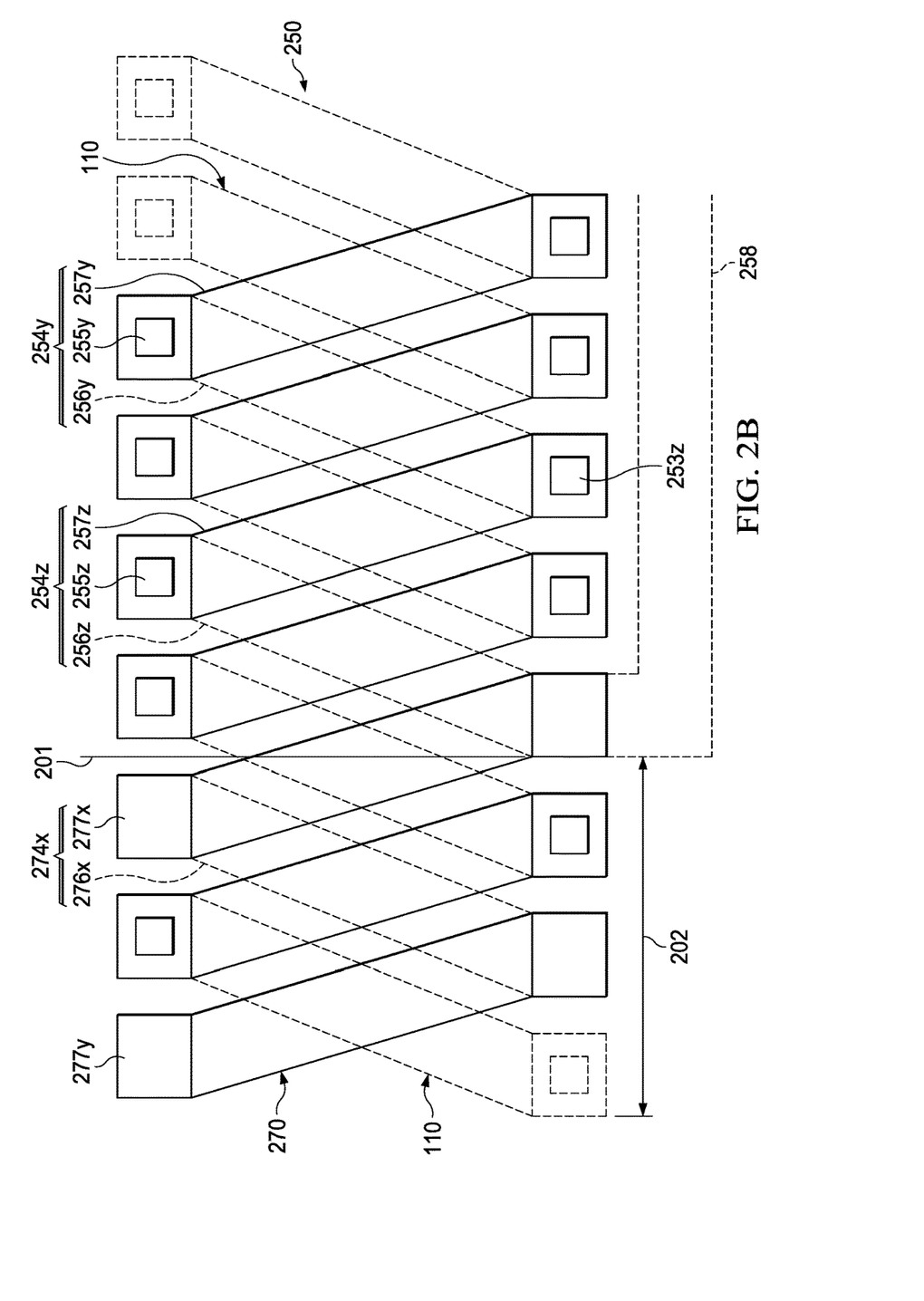
FIG. 2B shows a top partial exposed view of the fluxgate device with low fluxgate noise according to an aspect of the present disclosure.

FIG. 2B shows a top partial exposed view of the fluxgate device 200 to illustrate the wiring and structural relationships between the sense coil 250, the excitation coil 110, and the dummy coil 270 around the first pull-back edge 201. For the sake of simplicity and clarity, the compensation coil 130 is not shown in FIG. 2B and can be assumed to follow a similar wiring structure and configuration as the excitation coil 110. Moreover, the wiring and structured relationships as illustrated in FIG. 2B may be applicable to the second pull-back edge 203 and to the wirings (e.g., 120, 140, 260, and 280) of the second magnetic core 105 as well.

In general, a coil member of each of the sense coil 250, the excitation coil 110, and the dummy coil 270 includes a top coil member and a bottom coil member. The top coil member is formed in a first conductive layer above the magnetic core 101, whereas the bottom coil member is formed in a second conductive layer below the magnetic core 101. To form a contiguous coil member coiling around the magnetic core 101, one or more top coil member is connected to one or more bottom coil member by one or more vias. For instance, the coil member 254y of the sense coil 250 includes a top coil member 257y and a bottom coil member 256y. The top coil member 257y is connected to the bottom coil member 256y by a via 255y to form a contiguous coil member 254y. Similarly, the coil member 254z of the sense coil 250 includes a top coil member 257z and a bottom coil member 256z. The top coil member 257z is connected to the bottom coil member 256z by a via 255z to form a contiguous coil member 254z. Moreover, the top coil member 257z is connected to the bottom coil member 256y via a via 253z such that the coil member 254z forms a contiguous coil segment with the coil member 254y.

To minimize the impact of the fluxgate noise, the sense coil 250 may be terminated before reaching the proximity 202 of the terminal edge 104. In one implementation, for example, the sense coil 250 may be terminated outside of, and thus before reaching, the terminal region (e.g., 313 and/or 316 as shown in FIGS. 3, and/or 413 and/or 416 as shown in FIG. 4). In another implementation, for example, the sense coil 250 may be terminated outside of, and thus before reaching, the extension region (e.g., 332 and/or 336 as shown in FIGS. 3, and/or 432 and/or 436 as shown in FIG. 4). To terminate the sense coil 250, the fabrication process may simply prevent the formation of a via that can be used for connecting consecutive top and bottom coil members of the sense coil 250.

For instance, the sense coil 250 can be terminated before reaching the pull-back edge 201 by preventing the formation of a via that may otherwise connect the bottom coil member 256z and a top coil member 277x. Because the top coil member 277x is not connected to the bottom coil member 256z, the top coil member 277x is not a part of the sense coil 250 and thus, it does not transmit the fluxgate noise from the proximity 202 to the sense coil 250. Instead, the top coil member 277x becomes a part of the dummy coil 270, which serves as a structural replacement of the sense coil 250. The dummy coil 270 includes coil member 274x, which can be either a split coil member or a contiguous coil member depending on whether or not the top coil member 277x is connected to the bottom coil member 276x by a via. As shown in FIG. 2B, for example, the coil member 274x is a split coil member because there is no via for connecting the top coil member 277x and the bottom coil member 276x. However, if a via is formed to connect the top coil member 277x to the bottom coil member 276x, these two coil members may form a contiguous coil member.

As the dummy coil 270 serves as a structural replacement of the pulled-back sense coil 250, the coil members (e.g., 276x, 277y and 277x) of the dummy coil 270 interleave with the coil members of the excitation coil 110 within the proximity 202 of the terminal edge 104. The interleaving configuration allows the excitation coil 110 to have uniform pitches for generating more uniform magnetic field around the terminal edge 104 of the magnetic core 101. Moreover, the dummy coil 270 may extend to the extension region (e.g., 332 and 336 as shown in FIG. 3) from the terminal region (e.g., 313 and 316 as shown in FIG. 3) of the magnetic core 101. The extended dummy coil 270 provides a more uniform stress distribution across the magnetic core 101, as well as the dielectric layer that surrounds and abuts the magnetic core 101. Such a uniform stress distribution helps reduce or even prevent crackings around the magnetic core 101, and it may also help prevent delaminations of the magnetic core 101. To that end, the dummy coil 270 facilitates the reduction of fluxgate noise by distributing the magnetic field and stress more evenly around the proximity 202 of the terminal edge 104.

Figure 5:
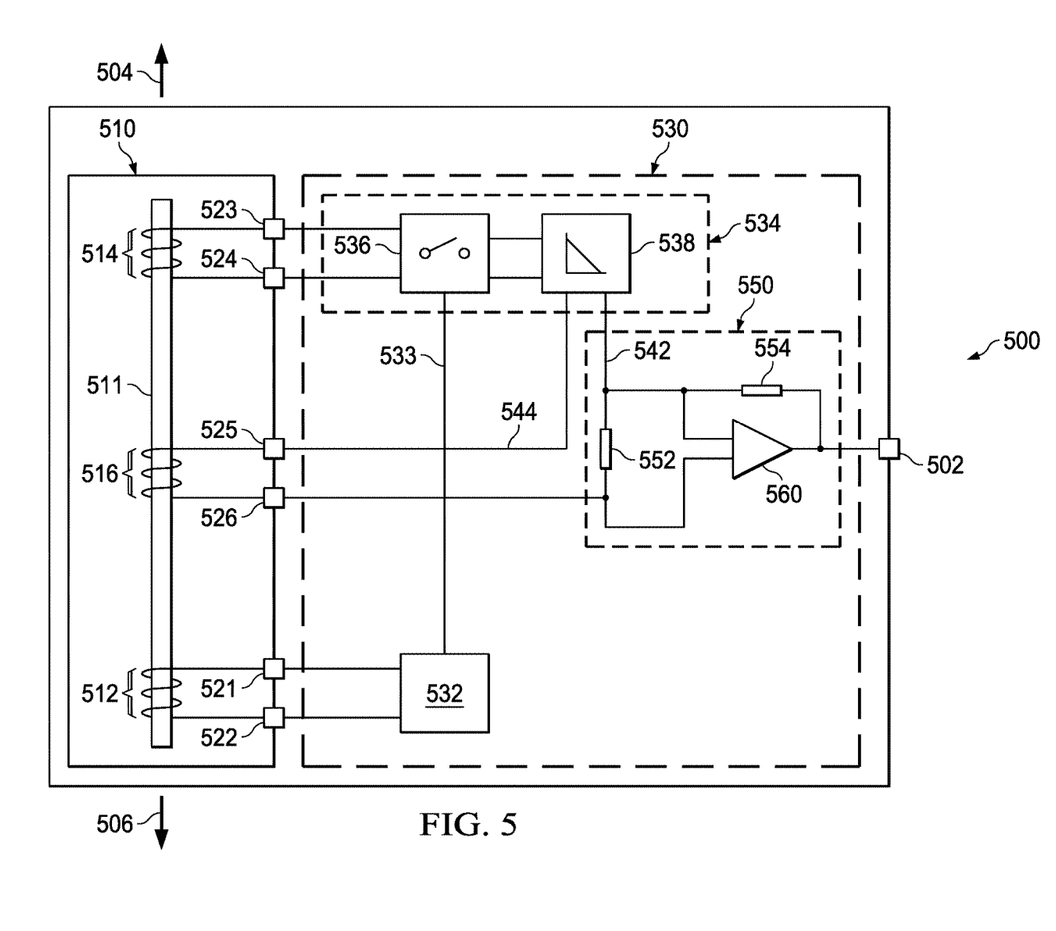
FIG. 5 shows a schematic view of an integrated fluxgate device according to an aspect of the present disclosure.

The fluxgate devices as shown and discussed in FIGS. 1-4 may be integrated with one or more processing circuits to form a single integrated circuit die. For example, FIG. 5 shows a schematic view of an integrated fluxgate device 500 according to an aspect of the present disclosure. The integrated fluxgate device 500 can be realized by an integrated circuit die incorporating a fluxgate device 510 and a fluxgate processing circuit 530.

The fluxgate device 510 is manufactured by modeling the fluxgate devices as shown in FIGS. 2-4 and by incorporating the structural and functional features described therein. For example, the fluxgate device 510 includes a magnetic core 511, an excitation coil 512, a sense coil 514, and a compensation coil 516 arranged in substantially the same ways as their counterparts as shown in FIGS. 2-4. The magnetic core 511 is oriented parallel to the first sensing direction 504 and the second sensing direction 506 of the integrated fluxgate circuit 500. The excitation coil 512 is extended between a first excitation terminal 521 and a second excitation terminal 522. The excitation coil 512 coils around the longitudinal edge of the magnetic core 511 to have a first number of excitation coil members within a proximity of the terminal edge of the magnetic core 511. The sense coil 514 is extended between a first sense terminal 523 and a second sense terminal 524. The sense coil 514 coils around the longitudinal edge of the magnetic core 511 to have a second number of sense coil members within the proximity of the terminal edge of the magnetic core 511. To reduce the amount of fluxgate noises being detected by the sense coil 514, the second number of sense coil members is less than the first number of excitation coil members. In one implementation, the sense coil 514 may have zero coil member within the proximity of the terminal edge of the magnetic core 511.

The fluxgate processing circuit 530 includes an excitation circuit 532, a sense circuit 534, and an output stage 550. The excitation circuit 532 is coupled to the excitation coil 512 via the first excitation terminal 521 and the second excitation terminal 522. The excitation circuit 532 is configured to generate an excitation signal including an excitation current to be conducted by the excitation coil 512. In a consecutive and alternating pattern, the excitation current may flow from the first excitation terminal 521 to the second excitation terminal 522 via the excitation coil 512 during a first time period, and from the second excitation terminal 522 to the first excitation terminal 521 via the excitation coil 512 during a second time period. By applying the alternating excitation current, the excitation circuit 532 is configured to drive the magnetic core 511 in and out of magnetic saturation during consecutive time periods. The change in magnetic saturation due to the presence of an external magnetic field is detected by the sense coil 514, and the output voltage is generated by the sense circuit 534.

The sense circuit 534 includes a fluxgate front-end (FFE) circuit 536 and an integrator circuit 538. The FFE circuit 536 is coupled to the sense coil 514 via the first sense terminal 523 and the second sense terminal 524. The FFE circuit 536 is configured to receive a sense signal from the sense coil 514 and demodulate the sense signal based on a synchronization scheme that synchronizes with the movement of the excitation current. In one implementation, for example, the FFE circuit 536 is coupled to the excitation circuit 532 to receive a synchronization signal 533. The synchronization signal 533 may indicate, during a certain period of time, whether the excitation current is flowing from the first excitation terminal 521 to the second excitation terminal 522 via the excitation coil 512, or from the second excitation terminal 522 to the first excitation terminal 521 via the excitation coil 512. Based on the synchronization signal 533, the FFE circuit 536 is configured to demodulate the sense signal using two or more switches, such as chopper switches.

The integrator circuit 538 is coupled to the FFE circuit 536 to receive the demodulated sense signal. The integrator circuit 538 is configured to integrate the demodulated sense signal to generate a sense voltage across a first integrator output 542 and a second integrator output 544. The sense voltage drives the compensation coil 516 via the first compensation terminal 525 and the second compensation terminal 526 to conduct a compensation current. The compensation current helps reset the magnetic field detected by the sense coil 514 within a closed-loop configuration. This reset process enables the sense circuit 534 to operate within a linear region so as to optimize the sensitivity of the integrated fluxgate device 500.

The output stage 550 is coupled to the first integrator output 542 and the second integrator output 544. The output stage 550 includes a matching impedance 552, a feedback impedance 554, and a differential amplifier 560. The matching impedance 552 provides matching between the differential inputs of the differential amplifier 560. The differential amplifier 560 is configured to generate a fluxgate output voltage to be delivered at the output port 502. The feedback impedance 554 provides a feedback path from the output of the differential amplifier 560.

Figure 6:
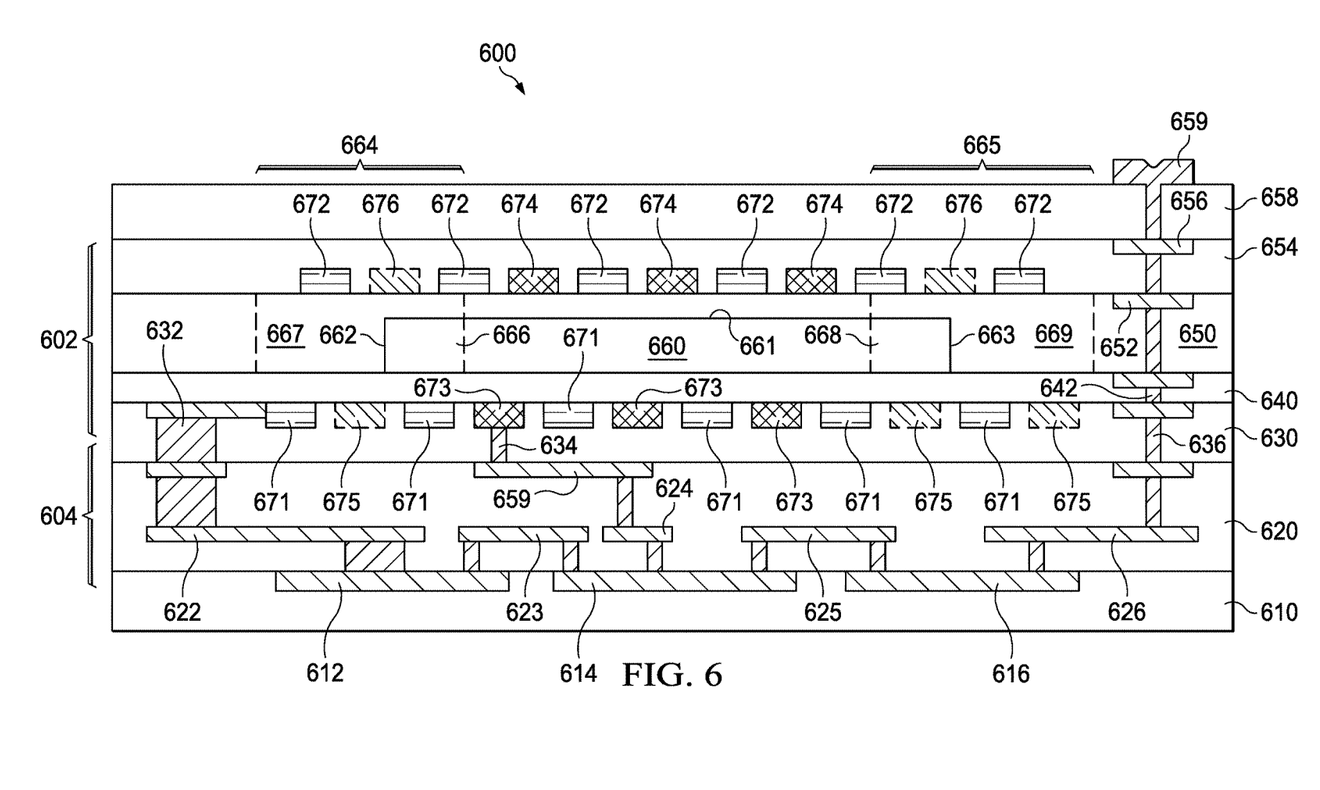
FIG. 6 shows a cross-sectional view of an integrated circuit integrating a fluxgate device and a fluxgate processing circuit according to an aspect of the present disclosure.

The schematic configuration of the fluxgate device 500 can be realized into an integrated circuit die using a semiconductor fabrication process. FIG. 6 shows a cross-sectional view of an integrated circuit 600 integrating a fluxgate device 602 and a fluxgate processing circuit 604 according to an aspect of the present disclosure. The integrated circuit 600 realizes the integrated fluxgate device 500, and thus, the fluxgate device 602 incorporated therein includes one or more structural and functional features of the fluxgate devices as shown and described in FIGS. 2-4. For the sake of simplicity and clarity however, the compensation coil (e.g., 516, 130, and 140) and its related terminals are not shown in FIG. 6.

The fluxgate processing circuit 604 can be formed on a semiconductor substrate 610, such as a silicon substrate. The semiconductor substrate 610 is implanted with one or more active regions, including a first active region 612, a second active region 614, and a third active region 616. Transistors are formed within these active regions to establish the circuitry as shown and described in FIG. 5. For instance, the first active region 612 may be used for forming transistors that establish the excitation circuit 532; the second active region 614 may be used for forming transistors that establish the sense circuit 534; and the third active region 616 may be used for forming transistors that establish the output stage 550.

The fluxgate processing circuit 604 includes one or more metal interconnect structures that connect the fluxgate process circuit 604 to the fluxgate device 602. The fluxgate processing circuit 604 also includes one or more interlayer dielectric (ILD) layers to support the metal interconnect structures and insulate them from each other and the active regions. The excitation circuit 532 in the first active region 612 is connected to an excitation coil member (e.g., 671) via a first metal interconnect structure 622 insulated by a first ILD layer 620, and via a second metal interconnect structure 632 insulated by a second ILD layer 630.

The sense circuit 534 in the second active region 612 is connected to a sense coil member (e.g., 673) via a first metal interconnect structure 624 insulated by the first ILD layer 620, and via a second metal interconnect structure 634 insulated by the second ILD layer 630. Moreover, the excitation circuit 532 in the first active region 612 may be connected to the sense circuit 534 in the second active region 612 via a first metal interconnect structure 623 to communicate the synchronization signal 533 as shown and described in FIG. 5.

The output stage 550 in the second active region 612 is connected to the sense circuit 534 in the second active region 614 via a first metal interconnect structure 625 insulated by the first ILD layer 620. Accordingly, the output stage 550 may receive the sense output voltage of the sense circuit 534. Moreover, the output stage 550 in the second active region 612 is connected to an output bond pad 659 to deliver the fluxgate output voltage. This connection may be established by a first metal interconnect structure 626 insulated by the first ILD layer 620, a second metal interconnect structure 636 insulated by the second ILD layer 630, a third metal interconnect structure 642 insulated by a third ILD layer 640, a fourth metal interconnect structure 652 insulated by a fourth ILD layer 650, and a fifth metal interconnect structure 656 insulated by a fifth ILD layer 654 and protected by a passivation layer 658.

The fluxgate device 602 is positioned above and generally isolated from the fluxgate processing circuit 604. The third IDL layer 640 may serve as an etch stop layer during the fabrication process of the fluxgate device 602 so as to prevent any part of the fluxgate processing circuit 604 from being etched. The third IDL layer 640 also helps insulate the fluxgate processing circuit 604 from contaminations (e.g., depositions of the magnetic core materials such as nickel and iron) introduced by the fabrication process of the fluxgate device 602. The third IDL layer 640 may include a nitride material such as silicon nitride.

The fluxgate device 602 may be formed within the second, third, fourth, and fifth ILD layers 630, 640, 650, and 654. Consistent with the disclosure of FIGS. 2-4, the fluxgate device 602 includes a magnetic core 660, an excitation coil (i.e., bottom coil members 671 and top coil members 672), a sense coil (i.e., bottom coil members 673 and top coil members 674), a compensation coil (not shown), and one or more dummy coils (e.g., bottom coil members 675 and top coil members 676).

The magnetic core 660 may be formed within the fourth ILD layer 650. The magnetic core 660 includes longitudinal edges 661 and terminal edges 662 and 663. The terminal edge 662 has a proximity 664 that includes a terminal region 666 within the magnetic core 660, and potentially, an extension region 667 that is positioned within the fourth ILD layer 650 and that abuts the terminal region 666. The sense coil has a lesser number of coil members within the proximity 664 than the excitation coil. In one implementation, for example, the sense coil has zero coil member within the proximity 664 as it is terminated outside of, and thus before reaching, the proximity 664. The excitation coil may extended beyond the terminal edge 662 to coil around the extension region 667. Moreover, the fluxgate device 602 may include a dummy coil (e.g., bottom coil member 675 and top coil member 676) within the proximity 664 to promote a more uniform magnetic field with the excitation coil and to protect the integrity of the magnetic core 660 and its surrounding dielectric layers (e.g., ILD layers 630, 640, 650, and 654).

Likewise, the terminal edge 663 has a proximity 665 that includes a terminal region 668 within the magnetic core 660, and potentially, an extension region 669 that is positioned within the fourth ILD layer 650 and that abuts the terminal region 668. The sense coil has a lesser number of coil members within the proximity 665 than the excitation coil. In one implementation, for example, the sense coil has zero coil member within the proximity 665 as it is terminated outside of, and thus before reaching, the proximity 665. The excitation coil may extended beyond the terminal edge 663 to coil around the extension region 669. Moreover, the fluxgate device 602 may include a dummy coil (e.g., bottom coil member 675 and top coil member 676) within the proximity 665 to promote a more uniform magnetic field with the excitation coil and to protect the integrity of the magnetic core 660 and its surrounding dielectric layers (e.g., ILD layers 630, 640, 650, and 654).

Figure 7:
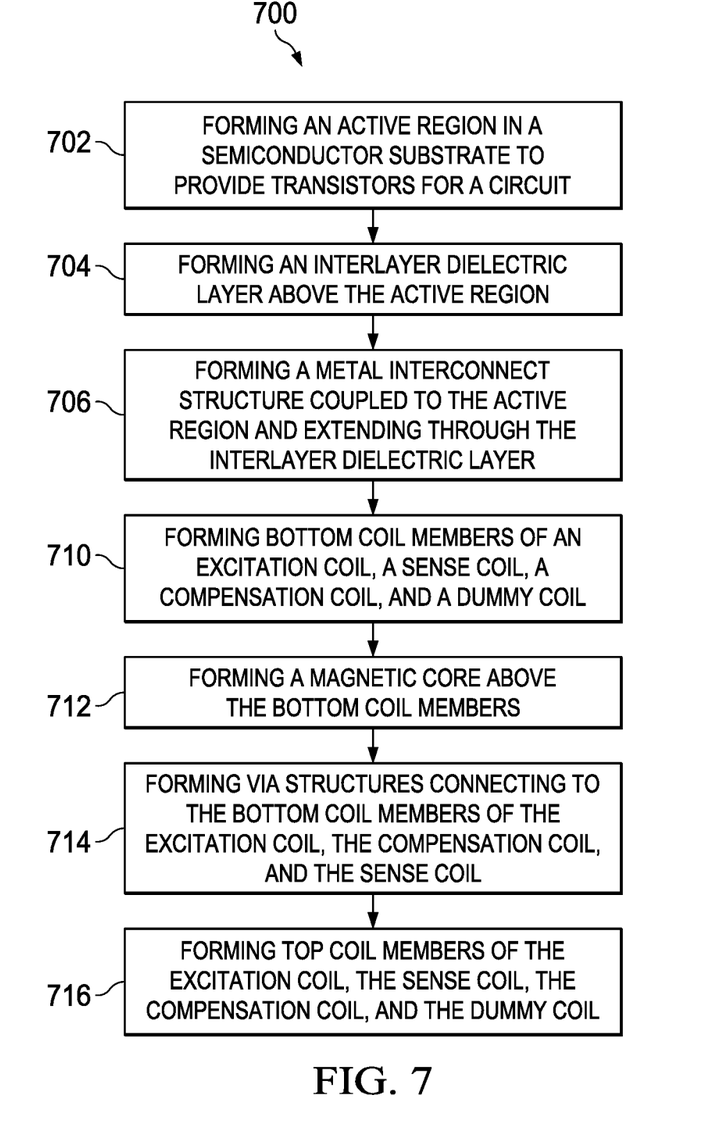
FIG. 7 shows a flow diagram of a method of fabricating an integrated circuit integrating a fluxgate device and a fluxgate processing circuit according to an aspect of the present disclosure.

FIG. 7 shows a flow diagram of a method 700 of fabricating an integrated circuit (e.g., 600) integrating a fluxgate device (e.g., 602) and a fluxgate processing circuit (e.g., 604) according to an aspect of the present disclosure. The method 700 begins at step 702, which involves forming an active region (e.g., 612, 614, and/or 616) in a semiconductor substrate (e.g., 610) to provide transistors for a circuit (e.g., 532, 534, and/or 550). Step 702 may be performed by an ion implantation process and a diffusion process.

The method 700 proceeds to step 704, which involves forming an interlayer dielectric layer (e.g., 620, 630, 640, 650, and/or 654) above the active region. Step 704 may be performed by an oxide deposition process and/or a nitride deposition process.

After each of the interlayer dielectric layer is formed, the method 700 proceeds to step 706, which involves forming a metal interconnect structure (e.g., 622, 623, 624, 625, and/or 626 after the ILD layer 620 is formed; 632, 634, and/or 636 after ILD layer 630 is formed) coupled to the active region and extending through the interlayer dielectric layer. Step 706 may be performed by one or more selective etching process and metal deposition process.

The method 700 proceeds to step 710, which involves forming bottom coil members of an excitation coil (e.g., 671), a sense coil (e.g., 673), a compensation coil, and a dummy coil (e.g., 675). Step 710 may be performed by one or more selective etching process and metal deposition process. In one implementation, step 710 may be performed by a single etching process using a single mask that defines the locations of the bottom coil members of the excitation coil (e.g., 671), the sense coil (e.g., 673), the compensation coil, and the dummy coil (e.g., 675).

The method 700 proceeds to step 712, which involves forming a magnetic core (e.g., 660) above the bottom coil members. In general, the magnetic core may be formed on an etch stop layer (e.g., 640), which protects the underlying circuits from subsequent patterning process of the magnetic core. The formation of the magnetic core may include the deposition of alternating magnetizable layers and insulation layers. The magnetizable layers include a magnetizable material such as nickel iron. The magnetic core may be magnetize to form magnetic domain patterns during an induced magnetization process.

The method 700 proceeds to step 714, which involves forming via structures (e.g., 255y and 255z) connecting to the bottom coil members of the excitation coil, the compensation coil, and the sense coil. The via structures of the excitation coil and the compensation coil may extend to the proximity of the terminal edge, whereas the via structure of the sense coil may reduce in number or omitted within the proximity of the terminal edge.

The method 700 proceeds to step 716, which forming top coil members of the excitation coil (e.g., 672), the sense coil (e.g., 674), the compensation coil, and the dummy coil (e.g., 676). In an implementation where the via structures of the sense coil reduce in number within the proximity of the terminal edge, the sense coil is configured to have a lesser number of coil members than the excitation coil within the proximity of the terminal edge. In another implementation where the via structures of the sense coil is completely omitted within the proximity of the terminal edge, the sense coil is configured to terminate outside, and thus before reaching, the proximity of the terminal edge. Step 716 may be performed by one or more selective etching process and metal deposition process. In one implementation, step 716 may be performed by a single etching process using a single mask that defines the locations of the top coil members of the excitation coil (e.g., 672), the sense coil (e.g., 674), the compensation coil, and the dummy coil (e.g., 676).

Consistent with the present disclosure, the term "configured to" purports to describe the structural and functional characteristics of one or more tangible non-transitory components. For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

Moreover, the term "exemplary" is used herein to mean serving as an example, instance, illustration, etc., and not necessarily as advantageous. Also, although the disclosure has been shown and described with respect to one or more implementations, equivalent alterations and modifications will be apparent upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. A device, comprising:
    a magnetic core having a longitudinal edge and a terminal edge;
    a dielectric layer having an extension region abutting the terminal edge of the magnetic core;
    a first coil coiling around the longitudinal edge of the magnetic core and having a first number of first coil members within a proximity of the terminal edge, the first coil extending from the terminal edge of the magnetic core and coils around the extension region of the dielectric layer; and
    a second coil coiling around the longitudinal edge of the magnetic core and having a second number of second coil members within the proximity of the terminal edge, the second number of second coil members less than the first number of first coil members; and
    a dummy coil having split coil members interleaving with the first coil members within the extension region of the dielectric layer.

2. The device of claim 1, wherein the second coil terminates before reaching the extension region of the dielectric layer.

3. The device of claim 1, wherein the second coil terminates after reaching the extension region of the dielectric layer.

4. The device of claim 1, wherein the split coil members of the dummy coil interleaves with the first coil members within the proximity of the terminal edge.

5. The device of claim 1, wherein:
    the terminal edge includes a straight edge defining a width;
    the proximity of the terminal edge is defined by a half of the width measured from the terminal edge toward and away from a center of the magnetic core.

6. The device of claim 1, wherein:
    the terminal edge includes a protrusion edge protruding away from a center of the magnetic core, the protrusion edge defining a protrusion distance;
    the proximity of the terminal edge is defined by the protrusion distance measured from the protrusion edge away from the center of the magnetic core and two times the protrusion distance measured from the protrusion edge toward the center of the magnetic core.

7. The device of claim 6, wherein the protrusion edge includes a semi-circular edge and the protrusion distance is defined by a radius of the semi-circular edge.

8. The device of claim 1, wherein the second number of second coil members is zero within the proximity of the terminal edge.

9. The device of claim 1, further comprising:
a semiconductor substrate positioned under the magnetic core;
an excitation circuit having first transistors formed in the semiconductor substrate, the excitation circuit coupled to the first coil;
a sense circuit having second transistors formed in the semiconductor substrate, the sense circuit coupled to the second coil; and
an insulation layer insulating the excitation circuit and the sense circuit from the magnetic core.

10. An integrated circuit, comprising:
a semiconductor substrate;
a circuit having transistor regions in the semiconductor substrate; and
a fluxgate device positioned above the circuit, the fluxgate device including:
a magnetic core having a longitudinal edge and a terminal region;
a dielectric layer having an extension region abutting the terminal region of the magnetic core;
a first coil coupled to the circuit, the first coil coiling around the longitudinal edge of the magnetic core and extending to the terminal region, the first coil extending from the terminal region of the magnetic core and coils around the extension region of the dielectric layer;
a second coil coupled to the circuit, the second coil coiling around the longitudinal edge of the magnetic core and terminated outside the terminal region; and
a dummy coil having split coil members interleaving with the first coil within the extension region of the dielectric layer and the terminal region of the magnetic core.

11. The integrated circuit of claim 10, wherein the split coil members of the dummy coil interleaving with the first coil within the terminal region of the magnetic core.

12. The integrated circuit of claim 10, wherein:
the terminal region includes a straight edge defining a width; and
the terminal region is defined by a half of the width measured from the straight edge toward a center of the magnetic core.

13. The integrated circuit of claim 10, wherein:
the terminal region includes a protrusion edge protruding away from a center of the magnetic core, the protrusion edge defining a protrusion distance; and
the terminal region is defined by two times the protrusion distance measured from the protrusion edge toward the center of the magnetic core.

14. The integrated circuit of claim 13, wherein the protrusion edge includes a semi-circular edge and the protrusion distance is defined by a radius of the semi-circular edge.

15. The integrated circuit of claim 10, wherein the circuit includes:

an excitation circuit having first transistors in the transistor regions, the excitation circuit coupled to the first coil;
a sense circuit having second transistors in the transistor regions, the sense circuit coupled to the second coil; and
an insulation layer insulating the excitation circuit and the sense circuit from the magnetic core.

16. An integrated circuit, comprising:
a semiconductor substrate;
a circuit having transistors formed in the semiconductor substrate; and
a fluxgate device positioned above the circuit, the fluxgate device including:
a magnetic core having a longitudinal edge and a terminal region;
a dielectric layer having an extension region abutting the terminal region of the magnetic core;
a first coil coupled to the circuit, the first coil coiling around the longitudinal edge of the magnetic core and extending to the terminal region, the first coil extending from the terminal region of the magnetic core and coils around the extension region of the dielectric layer;
a second coil coupled to the circuit, the second coil coiling around the longitudinal edge of the magnetic core and terminated outside the terminal region; and
a dummy coil having split coil members interleaving with the first coil across the extension region of the dielectric layer and the terminal region of the magnetic core.

17. The integrated circuit of claim 16, wherein:
the terminal region includes a straight edge defining a width; and
the terminal region is defined by a half of the width measured from the straight edge toward a center of the magnetic core.

18. The integrated circuit of claim 16, wherein:
the terminal region includes a protrusion edge protruding away from a center of the magnetic core, the protrusion edge defining a protrusion distance; and
the terminal region is defined by two times the protrusion distance measured from the protrusion edge toward the center of the magnetic core.

19. The integrated circuit of claim 18, wherein the protrusion edge includes a semi-circular edge and the protrusion distance is defined by a radius of the semi-circular edge.

20. The integrated circuit of claim 16, wherein the circuit includes:
an excitation circuit having first transistors of the transistors formed in the semiconductor substrate, the excitation circuit coupled to the first coil;
a sense circuit having second transistors of the transistors formed in the semiconductor substrate, the sense circuit coupled to the second coil; and
an insulation layer insulating the excitation circuit and the sense circuit from the magnetic core.

\* \* \* \* \*